United States Patent
Goldbach et al.

(10) Patent No.: US 8,946,821 B2
(45) Date of Patent: Feb. 3, 2015

(54) SRAM INTEGRATED CIRCUITS AND METHODS FOR THEIR FABRICATION

(75) Inventors: Matthias Goldbach, Dresden (DE); Peter Baars, Dresden (DE)

(73) Assignee: Globalfoundries, Inc., Grand Cayman (KY)

( * ) Notice: Subject to any disclaimer, the term of this patent is extended or adjusted under 35 U.S.C. 154(b) by 349 days.

(21) Appl. No.: 13/348,142

(22) Filed: Jan. 11, 2012

(65) Prior Publication Data

US 2013/0175627 A1    Jul. 11, 2013

(51) Int. Cl.
 *H01L 27/12*   (2006.01)
 *H01L 27/11*   (2006.01)
 *H01L 27/02*   (2006.01)

(52) U.S. Cl.
 CPC ........ H01L 27/1104 (2013.01); H01L 27/0207 (2013.01)
 USPC .... 257/350; 257/390; 257/393; 257/E27.098; 257/E27.099

(58) Field of Classification Search
 CPC .............................. H01L 27/11; H01L 27/1104
 USPC ........... 257/390, 393, E27.098, E27.099, 350
 See application file for complete search history.

(56) References Cited

U.S. PATENT DOCUMENTS

| | | | |
|---|---|---|---|
| 2004/0099885 A1* | 5/2004 | Yeo et al. | 257/208 |
| 2005/0124095 A1* | 6/2005 | Liaw | 438/128 |
| 2005/0221544 A1* | 10/2005 | Kwak et al. | 438/150 |
| 2007/0218622 A1* | 9/2007 | Lee et al. | 438/231 |

OTHER PUBLICATIONS

Maeda, T. et al., "Scalable TaN Metal Source/Drain & Gate InGaAs/Ge n/pMOSFETs," Symposium on VLSI Technology Digest of Technical Papers, pp. 62-63, (2011).

* cited by examiner

*Primary Examiner* — Ermias Woldegeorgis
(74) *Attorney, Agent, or Firm* — Ingrassia Fisher & Lorenz, P.C.

(57) ABSTRACT

SRAM integrated circuits are provided having pull up and pull down transistors of an SRAM cell fabricated in and on a silicon substrate. A layer of insulating material overlies the pull up and pull down transistors. Pass gate transistors of the SRAM cell are fabricated in a semiconducting layer overlying the layer of insulating material.

11 Claims, 14 Drawing Sheets

SRAM INTEGRATED CIRCUITS AND METHODS FOR THEIR FABRICATION

TECHNICAL FIELD

The present invention generally relates to SRAM integrated circuits and to methods for their fabrication, and more particularly relates to compact SRAM integrated circuits and to methods for forming integrated circuits having a stacked SRAM cell.

BACKGROUND

Static random access memory (SRAM) integrated circuits (ICs) are widely used, both as stand alone memories and as embedded memories in, for example, microprocessors. The size of such SRAM ICs has increased markedly so that memories in excess of one million bits are now common. As IC size has increased, so has the processing complexity. The increased IC size requires a reduction in the size of individual components and in the minimum feature size, the minimum width of lines and spaces within an individual component. Processing complexity increases as the feature size decreases at least in part because it becomes difficult to precisely define lines and to insure adequate spacing between features. There are practical limits as to how much the minimum feature size can be reduced. At the limit it becomes difficult to reliably fabricate ICs with acceptable performance characteristics and at a reasonable yield. Thus as memory size continues to increase, it becomes incumbent on circuit designers and fabricators to find ways to decrease the size of a basic memory cell that goes beyond merely reducing feature size.

Accordingly, it is desirable to provide SRAM integrated circuits having a stacked memory cell. In addition, it is desirable to provide methods for fabricating SRAM integrated circuits having reduced size, stacked memory cells. Furthermore, other desirable features and characteristics of the present invention will become apparent from the subsequent detailed description and the appended claims, taken in conjunction with the accompanying drawings and the foregoing technical field and background.

BRIEF SUMMARY

SRAM integrated circuits are provided in accordance with various embodiments. In accordance with one embodiment an SRAM integrated circuit is provided having pull up and pull down transistors of an SRAM cell fabricated in and on a silicon substrate. A layer of insulating material overlies the pull up and pull down transistors. Pass gate transistors of the SRAM cell are fabricated in a semiconducting layer overlying the layer of insulating material.

In accordance with a further embodiment, an SRAM integrated circuit is provided having four transistors of a six-transistor SRAM cell fabricated in and overlying a silicon substrate. The two additional transistors of the six-transistor SRAM cell are fabricated in and overlying a high mobility material semiconductor layer overlying the four transistors.

Methods are also provided for fabricating an SRAM integrated circuit. In accordance with one embodiment the method includes fabricating four transistors of a six-transistor SRAM cell in and on a silicon substrate, depositing a layer of insulator overlying the four transistors, and forming two transistors of the six-transistor SRAM cell in and on a semiconductor layer overlying the layer of insulator. Metal-filled vias are formed extending through the layer of insulator and selectively coupling the two transistors to the four transistors.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
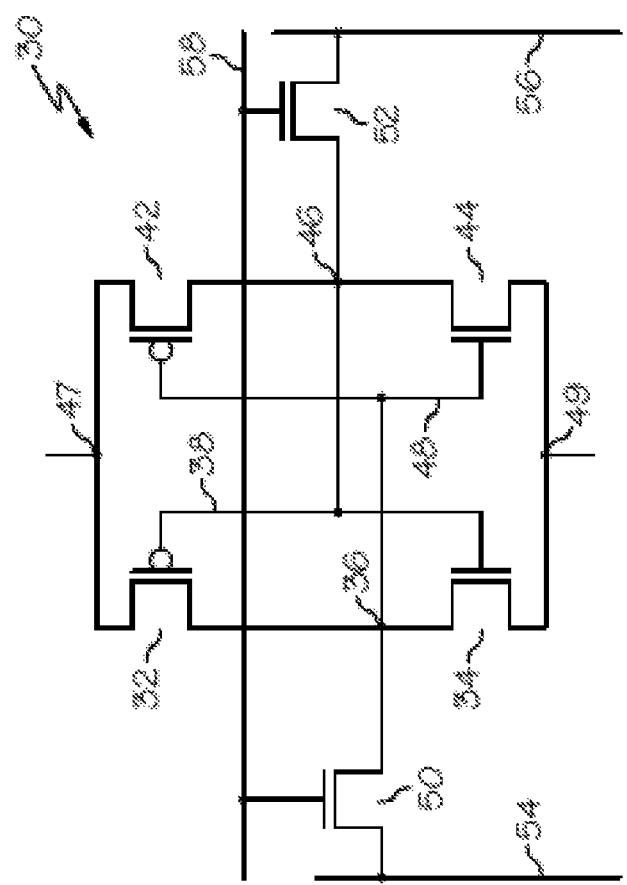
FIG. 1 illustrates a conventional six-transistor SRAM cell.

FIG. 1 is a circuit schematic for the industry standard six-transistor static random access memory (SRAM) cell 30. In an SRAM integrated circuit (IC) such a cell would be reproduced many times in a regular array of rows and columns. The standard cell is produced with metal oxide semiconductor field effect transistors (MOSFETs) or simply MOS transistors or FETs. An MOS transistor includes a gate electrode as a control electrode and spaced apart source and drain regions formed in a semiconductor substrate and between which a current can flow. A control voltage applied to the gate electrode controls the flow of current through a channel between the source and drain regions. The gate electrode is electrically insulated from the underlying channel by a gate dielectric. Such MOS transistors can be P-channel (PMOS) or N-channel (NMOS).

SRAM cell 30 includes two cross coupled inverters. The first inverter includes a PMOS pull up transistor 32 and an NMOS pull down transistor 34 joined at a common node 36. Transistors 32 and 34 have a common gate connection 38. The second inverter likewise includes a PMOS pull up transistor 42 and an NMOS pull down transistor 44 joined at a common node 46. Transistors 42 and 44 have a common gate connection 48. Cross coupling of the two inverters is accomplished by coupling common gate 38 to node 46 and by coupling common gate 48 to node 36. The sources of pull up transistors 32 and 42 are coupled to a first potential source 47, usually $V_{DD}$, and the sources of pull down transistors 34 and 44 are coupled to a second potential source 49, usually $V_{SS}$ or ground. The cell is accessed for reading or writing by NMOS pass gate transistors 50 and 52. Pass gate transistor 50 is coupled between a bit line (BL) 54 and common node 36. Pass gate transistor 52 is coupled between a complementary bit line (BLB) 56 and common node 46. The gates of pass gate transistors 50 and 52 are coupled to a word line (WL) 58. In the typical six-transistor SRAM cell, as just described, the pull up transistors are PMOS transistors and the pull down and pass gate transistors are NMOS transistors, but such choice is not required; designers can freely choose which transistors are PMOS and which transistors are NMOS.

As is well known, integrated circuits such as SRAM integrated circuits are formed in and on a semiconductor substrate with the fabrication process involving a series of photolithographic processing steps in which a layer of photosensitive material is exposed to radiation that passes through a photo mask to transfer images on the photo mask to the layer of photosensitive material. The layer of photosensitive material is then developed and the resulting patterned mask is used as a process mask for an etching, ion implantation, or other process step. The problems associated with the conventional fabrication of SRAM ICs is best illustrated by looking at a number of the photo mask layers needed for such fabrication and their interrelation as illustrated in FIGS. 2-4.

Figure 2:
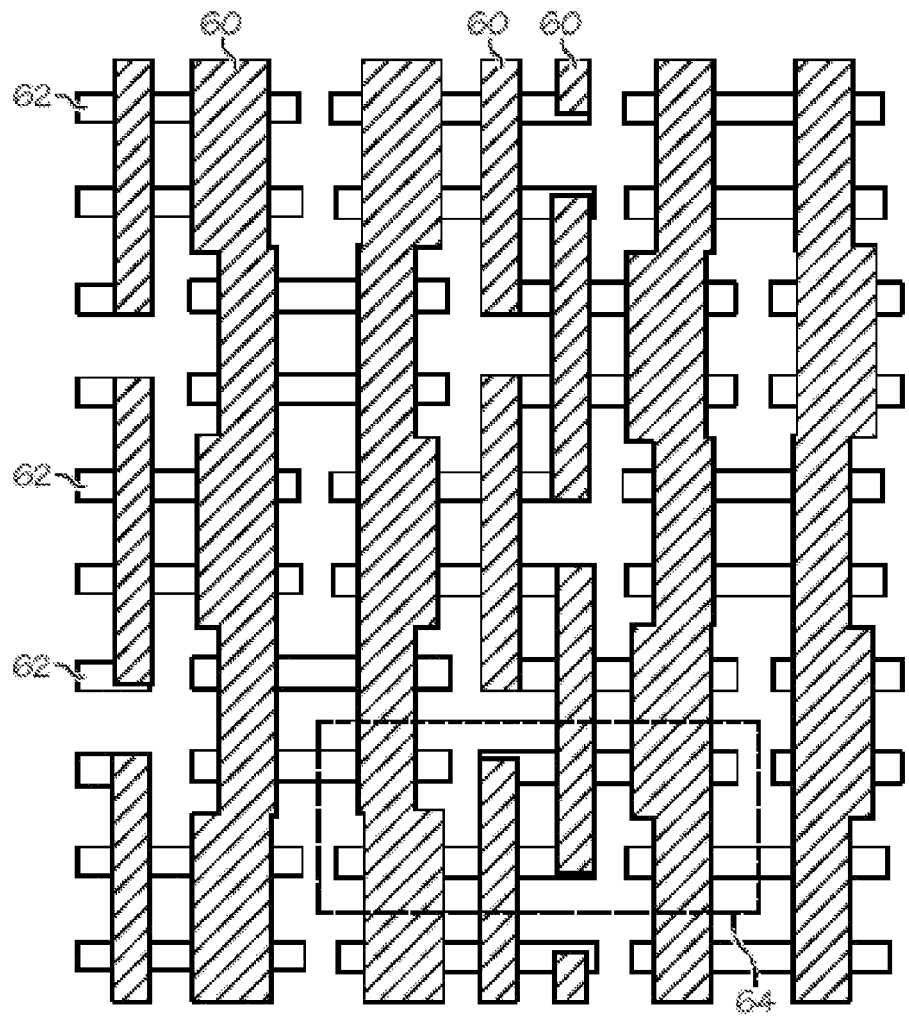
FIGS. 2-4 illustrate conventional photo masks used in fabricating a conventional SRAM cell.

FIG. 2 illustrates the overlay of two photo masks 60 and 62. Photo mask 60 defines the active semiconductor regions of the IC and photo mask 62 defines the gate electrode layer of a conventional SRAM IC. One bit of the SRAM array is indicated by the rectangular box 64.

Figure 3:
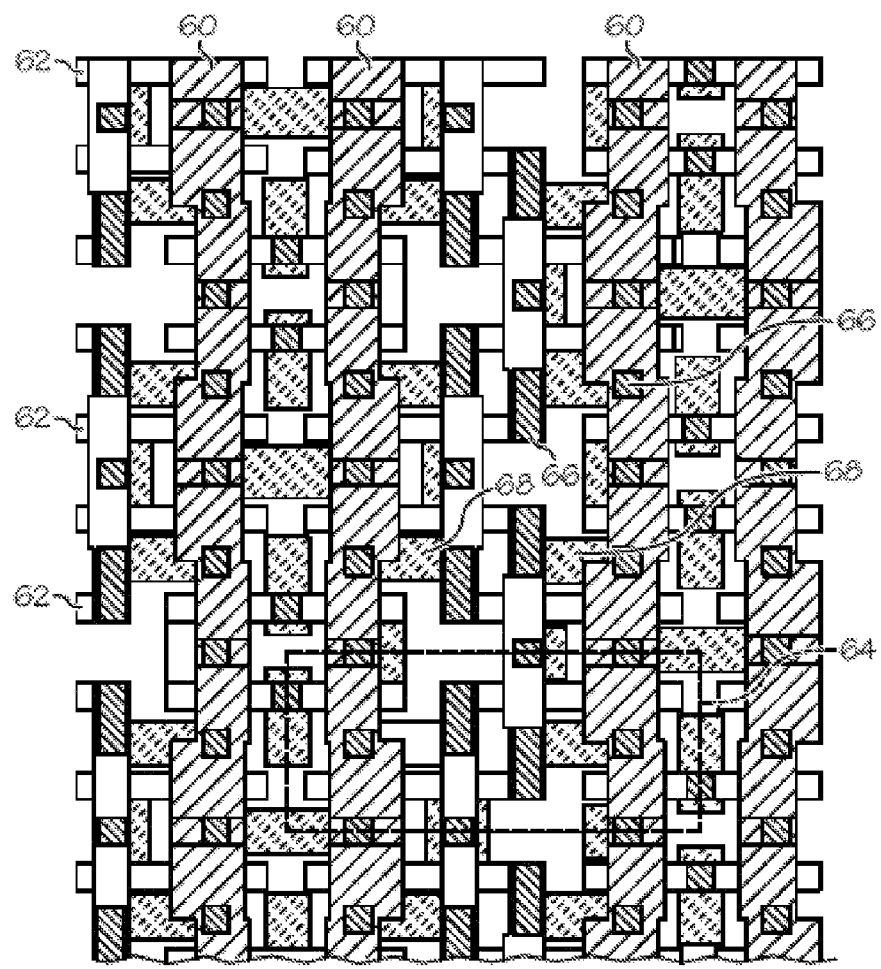
Figure 4:
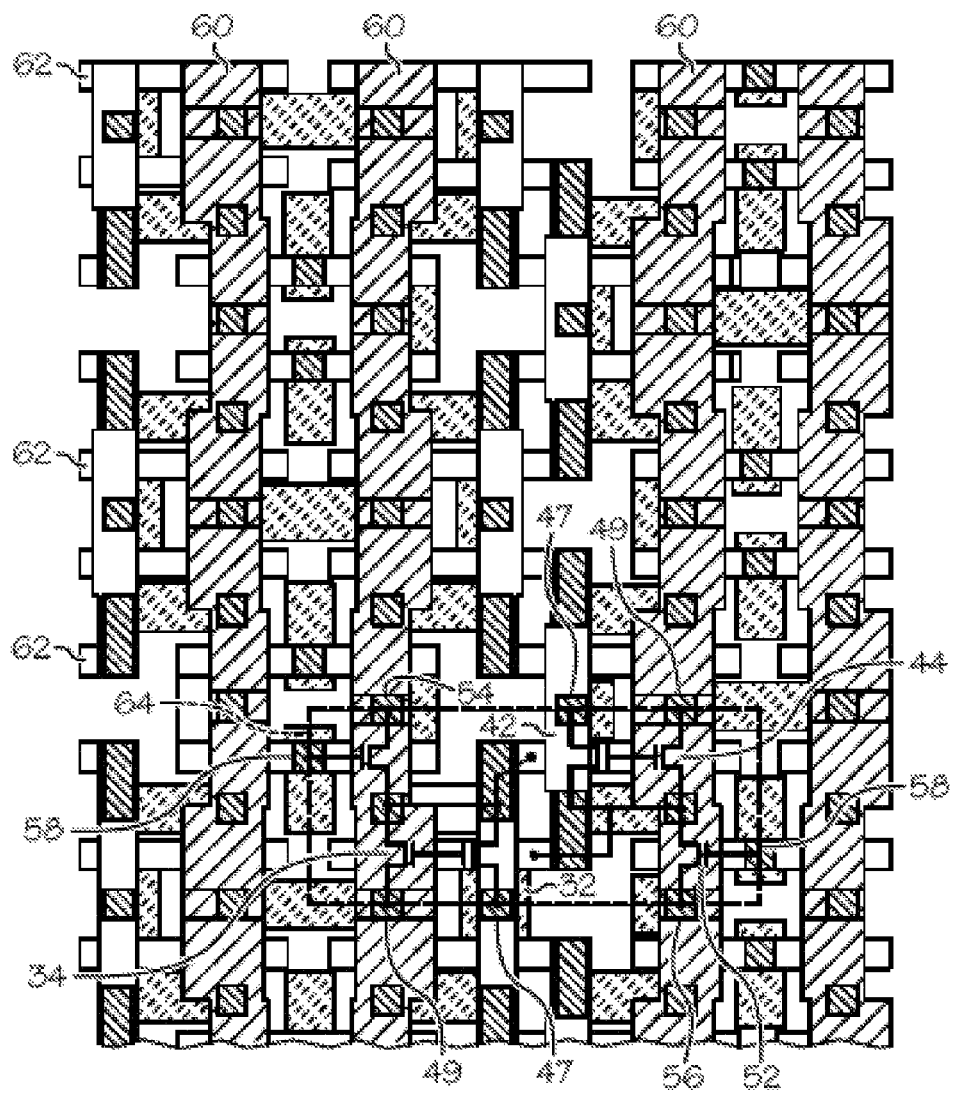

FIG. 3 illustrates the addition of two additional photo masks overlaid over those illustrated in FIG. 2. Photo mask 66 provides contact openings and photo mask 68 defines a first metal layer, usually referred to as metal one or M1. For convenience, FIG. 4 shows the same photo mask layers with the standard six-transistor SRAM cell layout superimposed. The squares of photo mask 66 provide contact between semiconductor regions and metal one. The rectangles of photo mask 66 provide contact between metal one and both the active semiconductor regions and the gate electrode layer. Subsequent mask layers (not illustrated) are used to pattern metal layer two (M2) and metal layer three (M3). Metal layer two provides, for example, $V_{DD}$ and the bit lines (BL and BLB) to the cell and metal layer three provides, for example, $V_{SS}$ and the word lines (WL) to the cell.

The six-transistor cell has become the standard for SRAM ICs because it has the minimum number of transistors to assure static memory states and adequate noise margins. Such a cell also allows differential signaling that makes small voltage swings easily detectable during read operations. Because of these and other attributes, the standard six-transistor cell will be used in large SRAM memories, but the size of the cell must be reduced. In conventional memories the size of the SRAM cell has been reduced by shrinking the minimum feature size and hence the size of individual transistors. There is a practical limit, however, to how much the minimum feature size can be reduced. In contrast, as will be described below, the size of a six-transistor SRAM memory cell, and thus the size of an entire SRAM integrated circuit, can be reduced by stacking the transistors of the cell instead of fabricating all transistors in the same plane. In accordance with various embodiments to be described below, four transistors of the six-transistor cell are fabricated in one plane of the IC and the additional two transistors are fabricated in an overlying plane. In such a stacked SRAM cell the overall cell size can be reduced without reducing the minimum feature size and without sacrificing the benefits of the six-transistor cell.

FIGS. 5-14 and the accompanying description illustrate an SRAM integrated circuit 100 and methods for its fabrication in accordance with various embodiments. SRAM IC 100 is fabricated with a plurality of six-transistor memory cells, but, as opposed to the conventional memory cell, four of the transistors of the cell are fabricated in and overlying a silicon substrate and two of the transistors are fabricated in and overlying a semiconductor layer that, in turn, overlies the four transistors. The circuit diagram for the SRAM cell used in SRAM IC 100 is the same as the circuit diagram show in FIG. 1, but the stacked cell structure described herein results in a compact cell layout that takes less space than the conventional cell layout. The two transistors fabricated in the overlying semiconductor layer could be the two pull up transistors, the two pull down transistors, or the two pass gate transistors. By way of illustration only, but without limitation, the fabrication of SRAM IC 100 will be described, in accordance with one embodiment, with the two pass gate transistors fabricated in the overlying semiconductor layer. This embodiment is the most efficient in terms of being achievable with the least number of needed metal layers. Minimizing the number of metal layers reduces defect-driven yield degradation and ensures lower capacitances. With appropriate changes, as will be explained later, the SRAM IC 100 can also be fabricated with either of the other two pairs of transistors fabricated in the overlying semiconductor layer.

Various steps in the fabrication of MOS semiconductor devices are well known and so, in the interest of brevity, many conventional fabrication steps will only be mentioned briefly herein or will be omitted entirely without providing the well-known process details. While the term "MOS" properly refers to a device having a metal gate electrode overlying an oxide gate insulator, that term will be used herein to refer to any device having a gate electrode, whether metal or other conductive material, overlying a gate insulator, whether oxide or other dielectric material, which overlies a semiconductor substrate. Again, the fabrication of SRAM IC 100 is best illustrated by viewing some of the photo masks used in the fabrication.

Figure 5:
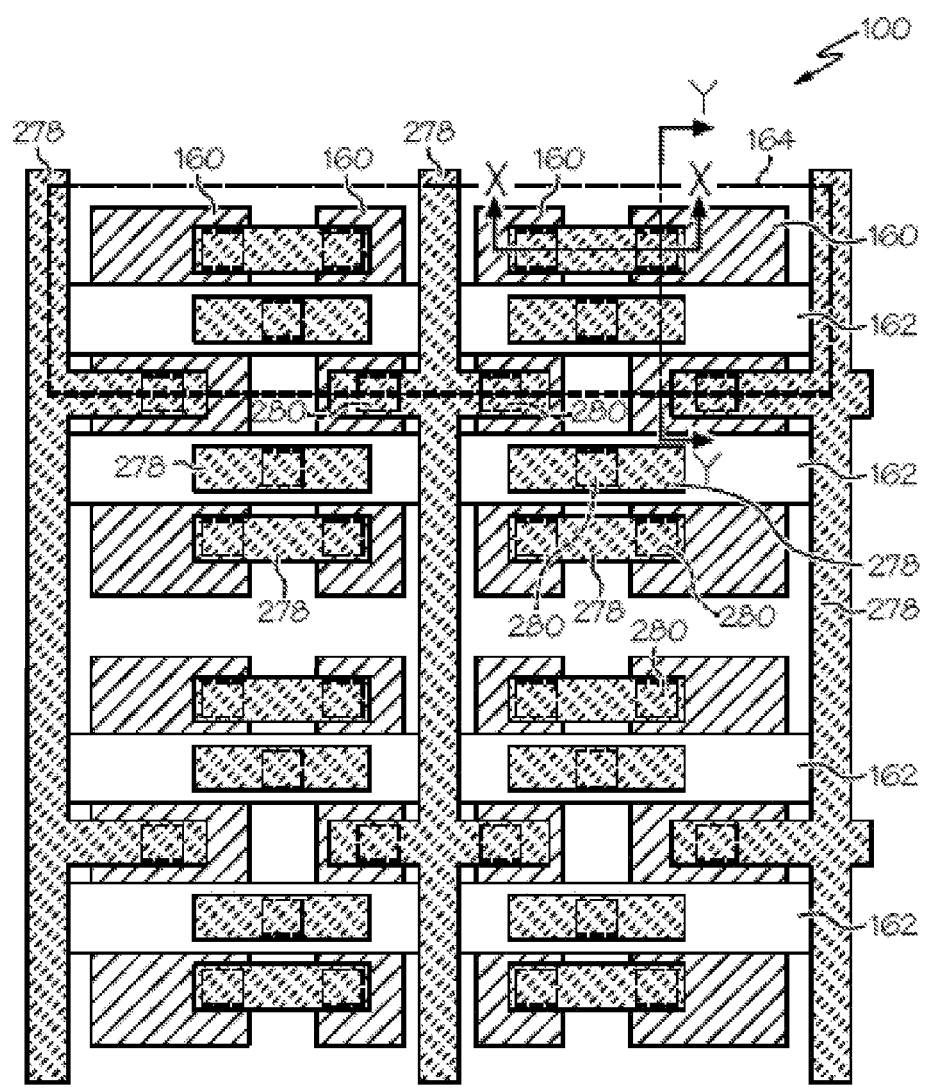
FIGS. 5, 6, 9-11, 13, and 14 illustrate photo mask used in fabricating the improved SRAM IC.
Figure 6:
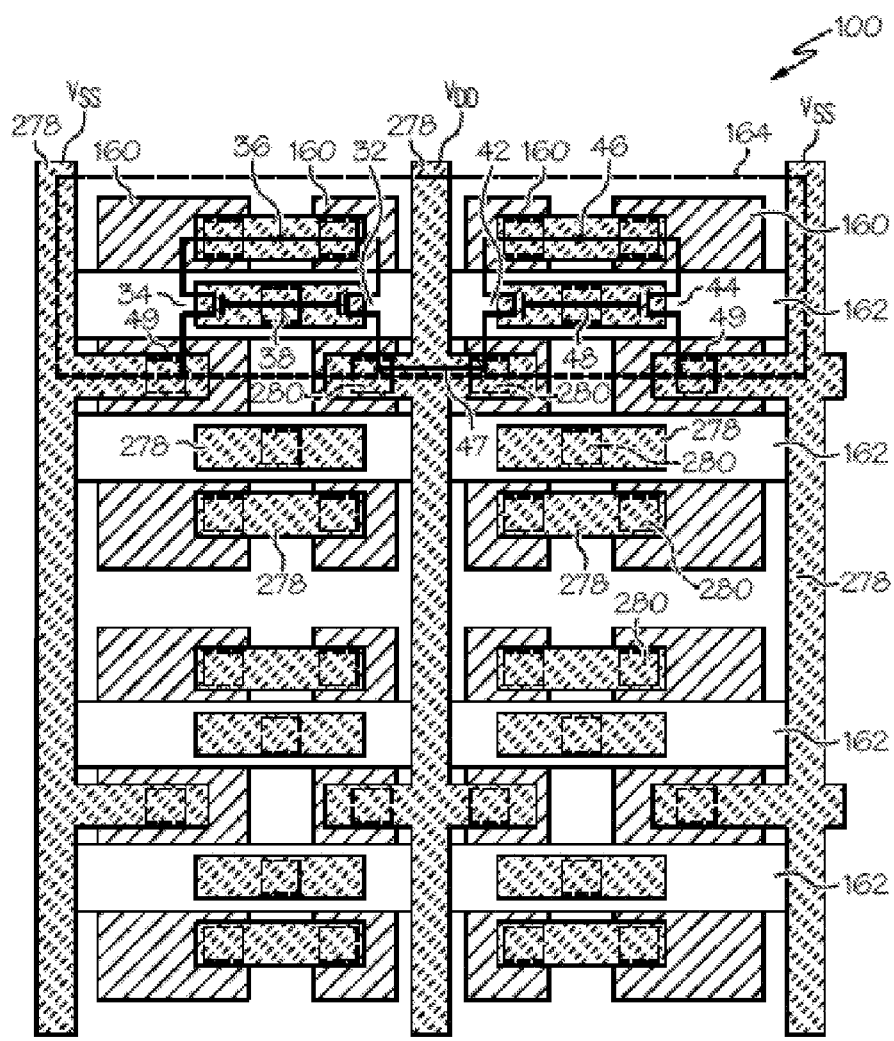

FIG. 5 illustrates the superposition of four of the early photo masks used in the fabrication of SRAM IC 100. Only four bits of the array are illustrated. An SRAM IC, of course, can include any number of such bits. A single bit is illustrated by the rectangle 164. Photo masks 160 and 162 define the active semiconductor area and the gate electrode layer, respectively. The active semiconductor regions defined by photo mask 160 are separated from each other by isolation regions such as shallow trench isolation. Photo mask 162 can be used to pattern the gate electrodes for either a gate first or a gate replacement gate electrode process. In accordance with an illustrative embodiment, but without limitation, a gate first process is described below. Photo mask 162 defines locations of gate electrodes for two pull up transistors 32 and 42 and two pull down transistors 34 and 44. Photo mask 278 defines a first metal layer and photo mask 280 defines conductive vias through which the first metal layer is selectively coupled to the underlying gate electrodes as required for interconnecting the cell. Portions of photo mask 280 obscured by the overlying photo mask 278 are shown in phantom by dotted lines. FIG. 6 is the same as FIG. 5 except that a circuit diagram illustrating the portions of a six-transistor SRAM cell formed by these four photo masks has been superimposed on the mask overlays.

Figure 7:
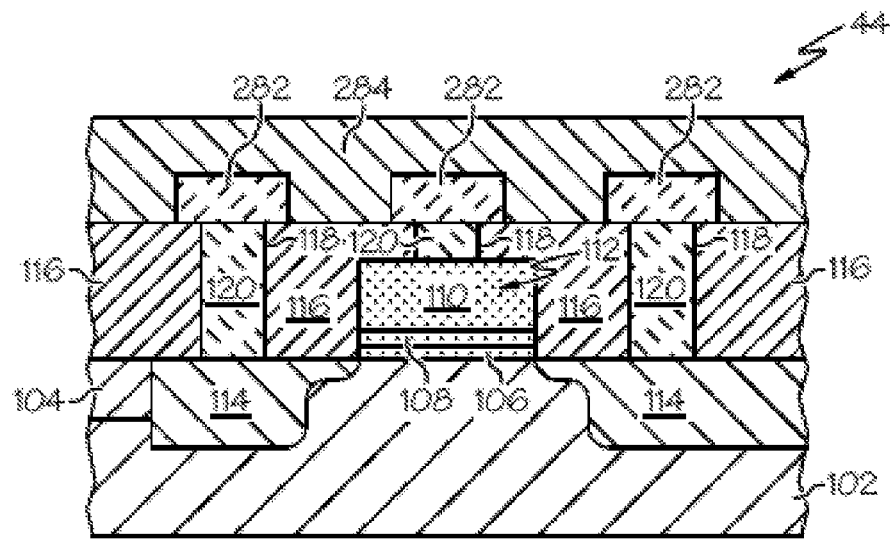
FIGS. 7, 8, and 12 schematically illustrate, in cross sectional views, an SRAM IC and method steps for its fabrication in accordance with various embodiments.
Figure 8:
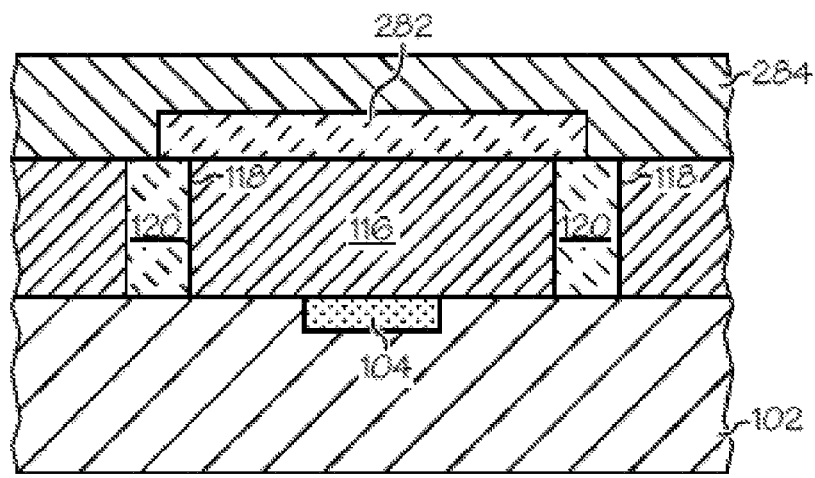

The early steps for fabricating SRAM IC 100 can be carried out in conventional manner. The early steps are illustrated, in cross sectional view, in FIGS. 7 and 8. FIGS. 7 and 8 are cross sectional views taken along the lines Y-Y and X-X, respectively, in FIG. 5. The fabrication begins, in accordance with one embodiment, by providing a semiconductor substrate 102. The semiconductor substrate can be, for example, silicon, silicon admixed with other elements such as germanium or carbon, or other semiconductor material. The semiconductor substrate may be referred to herein, for simplicity but without limitation, either as a semiconductor substrate or as a silicon substrate. The silicon substrate can be a bulk silicon wafer or a silicon on insulator (SOI) wafer. Active regions in the semiconductor substrate are delineated by photo mask 160, and isolation regions 104, such as STI regions, are formed to electrically isolate unrelated regions. Either before or after forming the isolation regions the active regions are doped with conductivity-determining impurities to form P-doped and N-doped wells (not illustrated) for the fabrication of NMOS transistors and PMOS transistors, respectively.

In accordance with one embodiment, a layer of gate insulator material 106 is deposited or otherwise formed overlying the semiconductor substrate. The layer of gate insulator material can be, for example, a layer of silicon oxide or a layer of high dielectric constant (high-k) gate insulator material, such as a layer of hafnium oxide, which may be layered with a layer of silicon oxide or other insulator. Further in accordance with this embodiment, a layer of work function-determining material 108 such as a layer of titanium nitride or tantalum nitride is deposited over the gate insulator, and a layer of a gate electrode material 110 such as a layer of polycrystalline silicon or a metal is deposited over the layer of work function-determining material. The layer of gate electrode material, layer of work function-determining material, and layer of gate insulator are patterned and etched to form gate structures 112 using photo mask 162 as an etch mask. Conventional processing steps are used to form source and drain regions 114 in the active semiconductor regions, for example by the implantation of conductivity-determining dopant ions using the gate electrodes as ion implantation masks. As is well known, sidewall spacers (not illustrated) may also be used as part of the ion implantation mask.

Following the formation of the source and drain regions, the method for fabricating SRAM IC 100 continues, in accordance with one embodiment, by depositing a layer of insulating material (an interlayer dielectric or ILD) 116 covering the semiconductor regions, STI, and gate electrode structures. The ILD layer can be, for example, a layer of silicon oxide deposited from a tetraethyl orthosilicate (TEOS) source. Via openings 118 are etched through the ILD layer using photo mask 280 as an etch mask. Conductive vias 120 are formed in the via openings, for example by depositing and planarizing successive layers of titanium, titanium nitride, and tungsten. The layers can be planarized, for example, by chemical mechanical planarization (CMP) to remove the portions of the layers overlying ILD 116. In accordance with one embodiment, a layer of conductive material such as a layer of aluminum is deposited overlying the ILD layer and is patterned using photo mask 278 as an etch mask to form metal one (M1) interconnects 282. In accordance with an alternate embodiment (not illustrated), an additional interlayer dielectric is deposited overlying ILD layer 116 and is patterned with a reverse image of photo mask 278 to etch a pattern extending into and through the additional ILD layer. A conductive material such as copper is deposited into the pattern and is planarized to form M1 interconnects 282 by a damascene process. As can be understood by referring to the circuit diagram overlaid on FIG. 6, metal one interconnects 282 bring $V_{DD}$ and Vss to the SRAM cell, contacting pull up transistors 32 and 42 at node 47 and pull down transistors 34 and 44 at node 49, respectively. Metal one interconnects 282 also provide the common gate connections 38 and 48 and form nodes 36 and 46. After patterning metal one interconnects 282, a further layer of dielectric material 284 is deposited overlying M1 interconnects 282.

Figure 9:
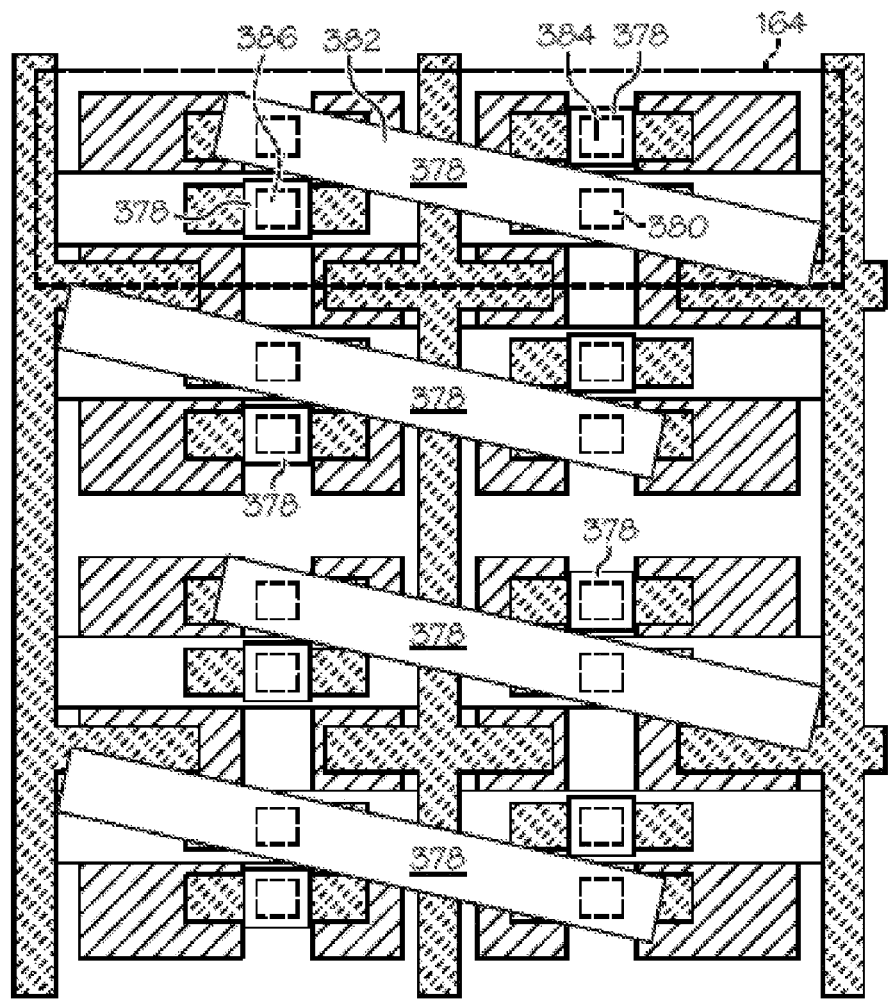
Figure 10:
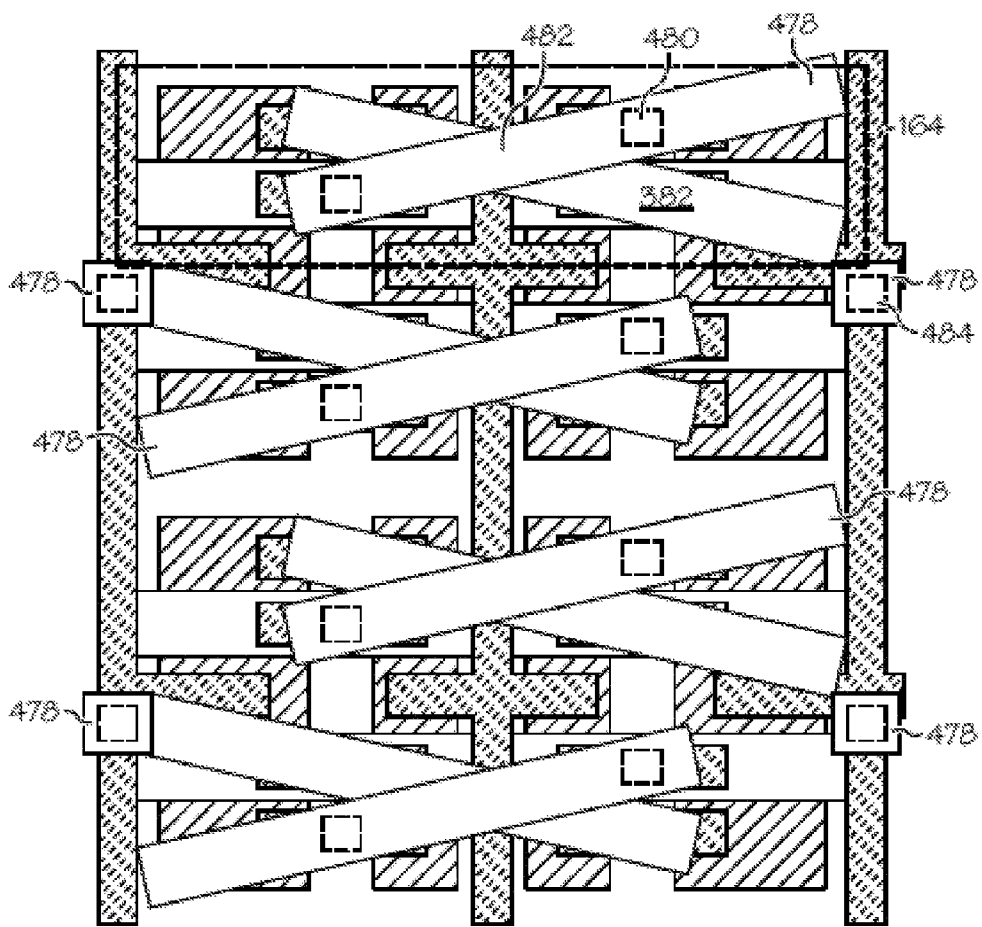
Figure 11:
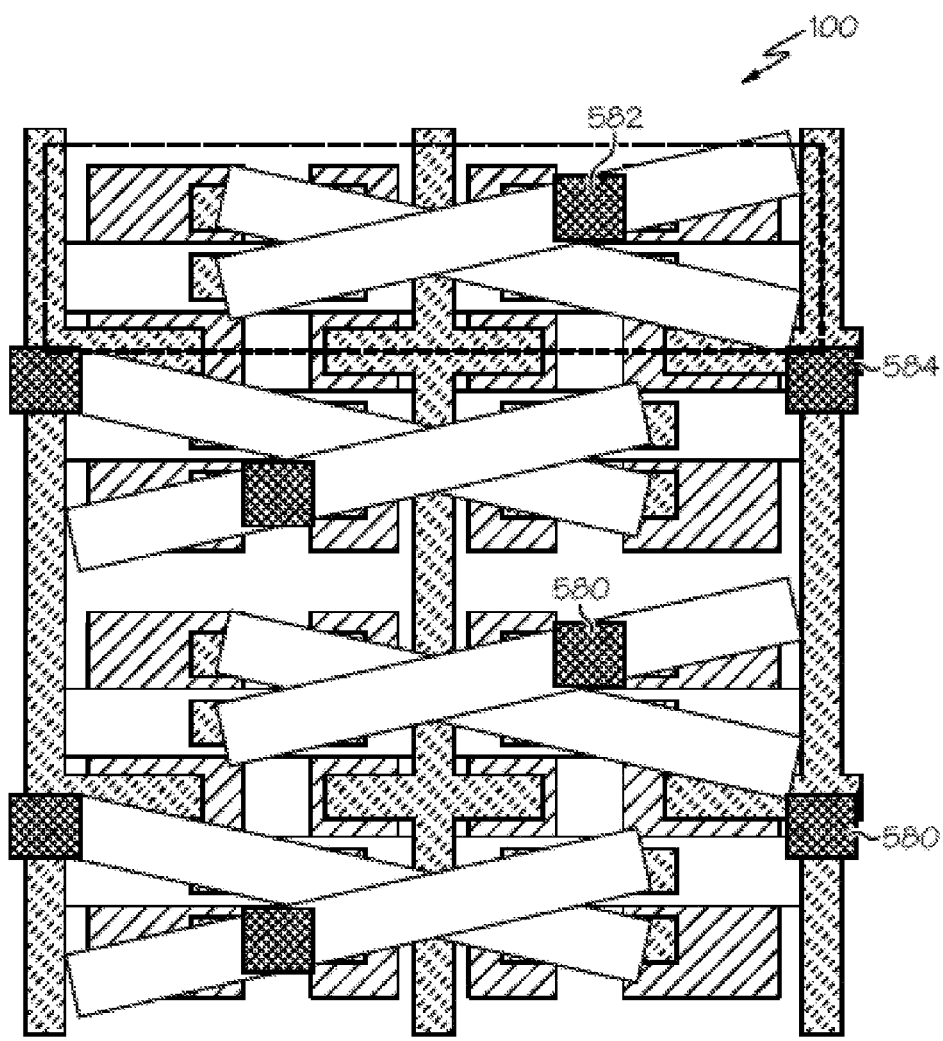

FIGS. 9-11 illustrate the superposition of further photo masks for the continued fabrication of SRAM IC 100 in accordance with exemplary embodiments. FIG. 9 illustrates the superposition of a via photo mask 380 and a second metal (M2) photo mask 378 overlying the photo masks 162 and 278 illustrated in FIG. 5. To avoid unduly complicating the FIGURES and obscuring the relationship between related layers, photo masks 160 and 280 are not shown. Portions of photo mask 380 obscured by overlying photo mask 378 are shown in phantom by dotted lines. Although not illustrated in cross section, the fabrication of SRAM IC, in accordance with this exemplary embodiment, continues by etching via openings through layer of dielectric material 284 using via photo mask 380 as an etch mask. Conductive vias are formed in the via openings, for example by the same method described above for conductive vias 120. A metal layer is then deposited and patterned using photo mask 378 to form a patterned second metal layer M2, for example by the same method described above for M1 interconnects 282. Referring back to FIG. 6, it can be seen that M2 forms an interconnection 382 between node 36 and common gate 48 of pull up transistor 42 and pull down transistor 44. Node 36 is located between pull up transistor 32 and pull down transistor 34. M2 also forms contacts 384 and 386 to node 46 and to common gate 38, respectively, that will be contacted by M3 as described below. The location of interconnection 382 and contacts 384 and 386 are noted on the photo mask 378. A layer of dielectric material is deposited overlying the patterned second metal layer M2.

FIG. 10 illustrates the superposition of a via photo mask 480 and a third metal (M3) photo mask 478 overlying the photo mask 378 illustrated in FIG. 9. Again, to avoid unnecessarily confusing FIG. 10, only the relationship between metal two (M2) and metal three (M3) is illustrated. Portions of photo mask 480 obscured by overlying photo mask 478 are shown in phantom by dotted lines. Although not illustrated in cross section, the fabrication of SRAM IC, in accordance with this exemplary embodiment, continues by etching via openings through the layer of dielectric material overlying the patterned second metal layer M2 using via photo mask 480 as an etch mask. Conductive vias are formed in the via openings, for example by the same method described above for conductive vias 120. A metal layer is then deposited and patterned using photo mask 478 to form a patterned third metal layer M3, for example by the same method described above for M1 interconnects 282. M3 selectively contacts the M2 contacts 384 and 386 (see FIG. 9) overlying node 46 and common gate 38 to form an interconnect 482 between the node and the common gate. M3 also forms contact 484 selectively contacting M2 line 382. Interconnect 482 and contact 484 are indicted on photo mask 478. In combination, the second and third metal layers (M2 and M3) interconnect the pull up and pull down transistors as a pair of cross coupled inverters. A layer of dielectric material 390 (illustrated in FIG. 12) is deposited overlying the patterned third metal layer M3 and overlying the pull up transistors 32 and 42 and the pull down transistors 34 and 44. The patterning of M2 and M3 complete the cross coupled inverters formed by pull up transistors 32 and 42 and pull down transistors 34 and 44 formed in and overlying semiconductor substrate 102.

FIG. 11 illustrates the superposition of a via mask 580 overlying the photo masks illustrated in FIG. 10. Via mask 580 is used as an etch mask to etch via openings through layer of dielectric material 390 overlying the patterned third metal layer M3. Conductive vias 582 and 584 are formed in the via openings, for example by the same method described above for conductive vias 120. The location of conductive vias 582 and 584 are indicated on photo mask 580. Conductive vias 582 and 584 form contacts to interconnect 482 and to contact 484 (see FIG. 10), respectively. Conductive vias 582 and 584 will be used, as explained below, to provide interconnections between pass gate transistors 50 and 52 and nodes 36 and 46 of the cross coupled inverters, respectively.

Figure 12:
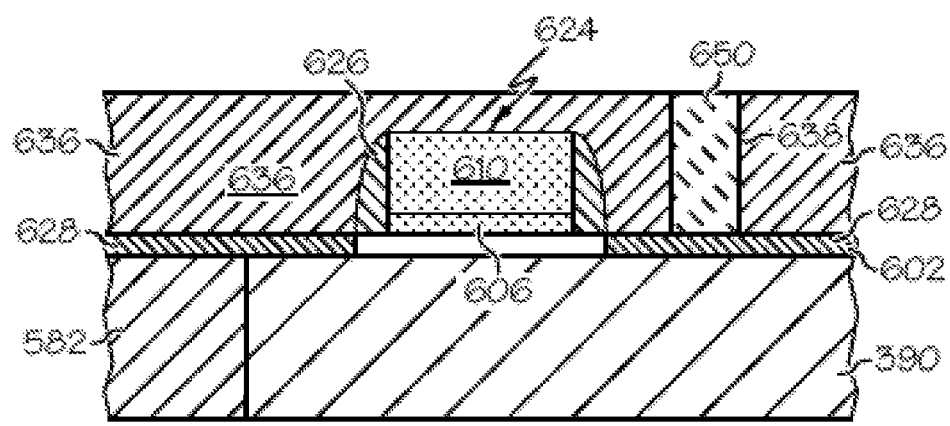
Figure 13:
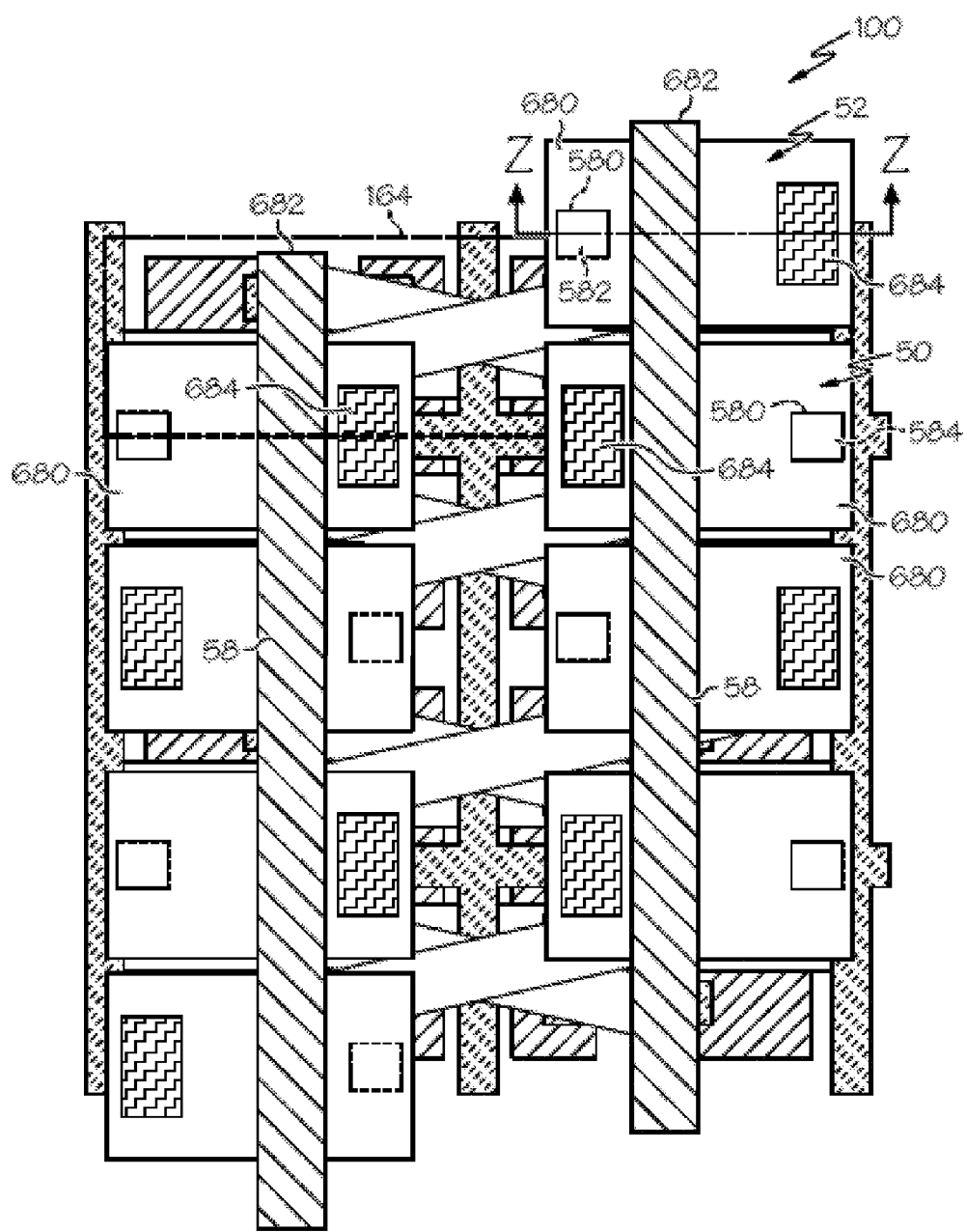

FIG. 12 illustrates, in cross section, a portion of SRAM IC 100 taken along the line Z-Z through pass gate transistor 52 in FIG. 13, including layer 390 of dielectric material and other layers overlying layer 390. Referring to FIG. 12, a layer of semiconductor material 602 in which pass gate transistors 50 and 52 are to be formed is provided overlying layer of dielectric material 390 and conductive vias 582 and 584 (only via 582 is illustrated in this cross section). Layer of semiconductor material 602 can be, for example, a layer of high mobility semiconductor material having a band energy level of about 4.4 eV to about 4.6 eV below the vacuum level. For example, for PMOS transistors the layer of high mobility semiconductor material can be germanium having a valence band energy of about 4.4 eV, and for NMOS transistors the layer of high mobility semiconductor material can be indium gallium arsenide having a conduction band energy of about 4.6 eV. Layer 602 can be formed, for example, by physical vapor deposition of the material followed by thermal recrystallization or by the bonding and subsequent thinning of a wafer of the semiconductor material to layer 390. For NMOS pass gate transistors, the layer of semiconductor material can be, for example, indium gallium arsenide.

FIG. 13 illustrates a superposition of three additional photo masks that are used, in accordance with various embodiments, after the formation of the layer of semiconductor material 602. An active area photo mask 680 is used to define active areas in semiconductor layer 602 in which pass gate transistors 50 and 52 are to be formed. A gate structure photo mask 682 is used to define gate structures and word lines, and a bit line contact mask 684 is used to form conductive vias for coupling the pass gate transistors to bit lines and complementary bit lines. To avoid confusing the FIGURE, photo masks 680, 682, and 684 are shown overlaid over only photo masks 478 and 580 (See FIGS. 10 and 11). The portions of photo mask 580 that are obscured by the other masks are shown in phantom by dotted lines.

Referring to both FIG. 12 and FIG. 13, photo mask 680 is used as an etch mask to remove portions of semiconductor material layer 602 from non-active areas. The non-active areas can be filled with an insulating material (not illustrated) to isolate unrelated active areas. A layer of gate insulator 606, such as a layer of aluminum oxide, is deposited overlying the active areas and a layer of gate electrode forming material 610 is deposited overlying the layer of gate insulator. The gate electrode forming material can be, for example, tantalum nitride.

In accordance with one embodiment, gate structure mask 682 is used as an etch mask to pattern and etch the layer of gate electrode forming material and underlying layer of gate insulator material to form gate electrodes 624 and word lines 58. The gate electrode material can be etched, for example by reactive ion etching (RIE). After etching the gate electrode forming material, a layer of spacer forming material, such as a layer of silicon nitride or silicon oxide, is deposited and anisotropically etched, for example by RIE, to form sidewall spacers 626. A metal layer such as a layer of nickel is deposited overlying layer of semiconductor material 602 and is heated to a temperature of about 250° C. to about 400° C. to alloy the metal with the semiconductor material to form source-drain regions 628. The source-drain regions are spaced apart from the gate structures by the sidewall spacers. The heating is continued for a sufficient length of time to cause the alloy to extend through the thickness of the semiconductor layer so that the alloy makes electrical contact to conductive vias 582 and 584 and couples the source-drain regions of pass gate transistors 50 and 52 to nodes 36 and 46, respectively. An alloy of nickel with indium gallium arsenide or an alloy of nickel and germanium, for example, each has a work function of about 4.5 eV and therefore achieves a low Ohmic Schottky contact for the source-drain regions and the contact to nodes 36 and 46.

After forming the source-drain alloy, a further ILD layer 636 is deposited overlying semiconductor layer 602, source-drain regions 628 and gate electrodes 624. Via photo mask 684 is used to etch via openings 638 through layer 636 to expose a portion of the source-drain regions of pass gate transistors 50 and 52 to which bit lines and complementary bit lines are to be coupled. Conductive vias are formed by filling the via openings with a conductive material such as a barrier layer of tantalum nitride and a layer of deposited copper to form conductive bit line and complementary bit line vias 650. The excess tantalum nitride and copper overlying ILD layer 636 can be removed, for example, by CMP.

In accordance with an alternate embodiment, instead of making a connection between the source-drain regions of the pass gate transistors and nodes 36 and 46 by forming an alloy that extends completely through the thickness of semiconductor layer 602 to contact conductive vias 582 and 584, the connection is made by including additional via openings (not illustrated) in via photo mask 684 to form additional via openings through ILD layer 636 to expose portions of source-drain regions 628 and underlying conductive vias 582 and 584. The additional via openings are then filled with conductive material to form contacts coupling the source-drain regions of pass gate transistors 50 and 52 to nodes 36 and 46 at the same time bit line vias 650 are formed.

Figure 14:
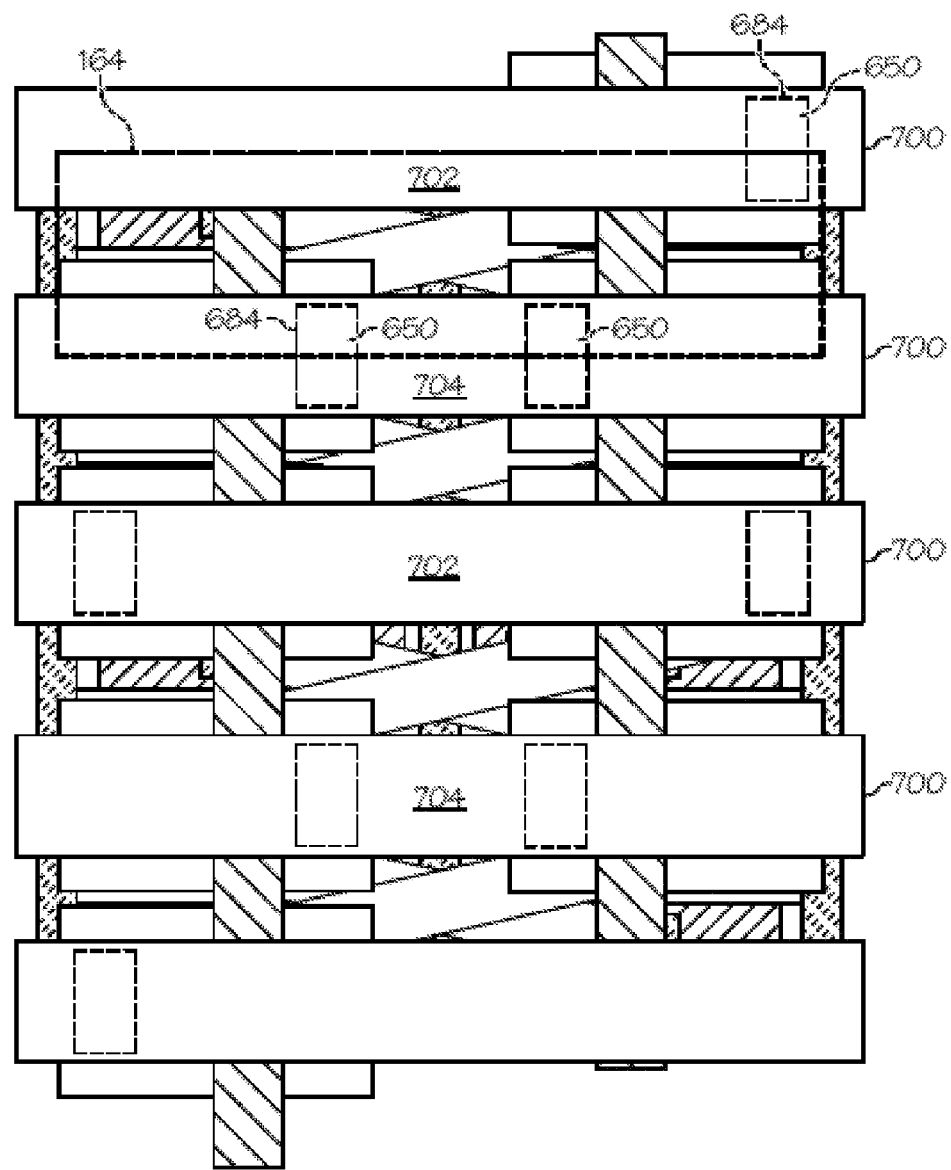

In accordance with one embodiment, the SRAM cell of SRAM IC 100 is completed by depositing and patterning a metal layer to form bit lines and complementary bit lines. The metal layer is deposited overlying ILD layer 636 and contacting conductive bit line vias 650. The metal layer is patterned by using photo mask 700 as illustrated in FIG. 14. Photo mask 700 is illustrated overlaid over photo masks 680, 682, and 684 illustrated in FIG. 13. Portions of photo mask 684 that are obscured by the overlying photo masks are illustrated in phantom by dotted lines. Photo mask 700 is used to pattern bit lines 54 and complementary bit lines 56 to complete the six-transistor SRAM cell that is repeated any number of times to form the memory array of SRAM IC 100.

In the illustrated embodiments the four transistors fabricated in underlying semiconductor material are the two pull up transistors and the two pull down transistors while the two pass gate transistors are fabricated in the overlying layer of high mobility semiconductor material. As stated above, in accordance with alternative embodiments the stacked SRAM cell can also be designed and fabricated with the pull up transistors or the pull down transistors in the overlying semiconductor layer. If the transistors fabricated in the overlying layer are PMOS transistors (typical for pull up transistors), the semiconductor layer must be appropriate for PMOS transistors such as a layer of germanium. If the transistors fabricated in the overlying layer are NMOS transistors (typical for either pull down transistors or pass gate transistors), the semiconductor layer must be appropriate for NMOS transistors such as a layer of indium gallium arsenide. In the illustrated embodiments the number of metal layers needed to complete the SRAM cell is minimized: $V_{DD}$ and $V_{SS}$ are formed by metal one, the cross coupled inverters are interconnected by metal two and metal three, and the bit lines are formed by a metal layer overlying the high mobility semiconductor layer. If the pull up and pass gate transistors are formed in the lower level, $V_{DD}$, word lines and bit lines have to be formed in the first three metal layers, $V_{SS}$ has to be formed overlying the high mobility semiconductor layer and additional metallization is required to cross couple the inverters. If the pull down and pass gate transistors are formed in the lower level, $V_{SS}$, word lines, and bit lines have to be formed in the first three metal layers, $V_{DD}$ has to be formed overlying the high mobility semiconductor layer and additional metallization is required to cross couple the inverters.

In the foregoing description the four transistors of each SRAM cell that are formed in and overlying semiconductor substrate 102 have been illustrated as conventional planar MOS transistors. In accordance with a further embodiment, the four transistors of the cell are fabricated as FinFET transistors to improve the performance and perhaps reduce the size of the SRAM IC. A FinFET is a type of transistor that lends itself to the dual goals of reducing transistor size while maintaining transistor performance. The FinFET is a three dimensional transistor formed in a thin fin that extends upwardly from a semiconductor substrate. Transistor performance, often measured by its transconductance, is proportional to the width of the transistor channel. In a FinFET the transistor channel is formed along the vertical sidewalls of the fin, so a wide channel, and hence high performance, can be achieved without substantially increasing the area of the substrate surface required by the transistor.

Figure 15:
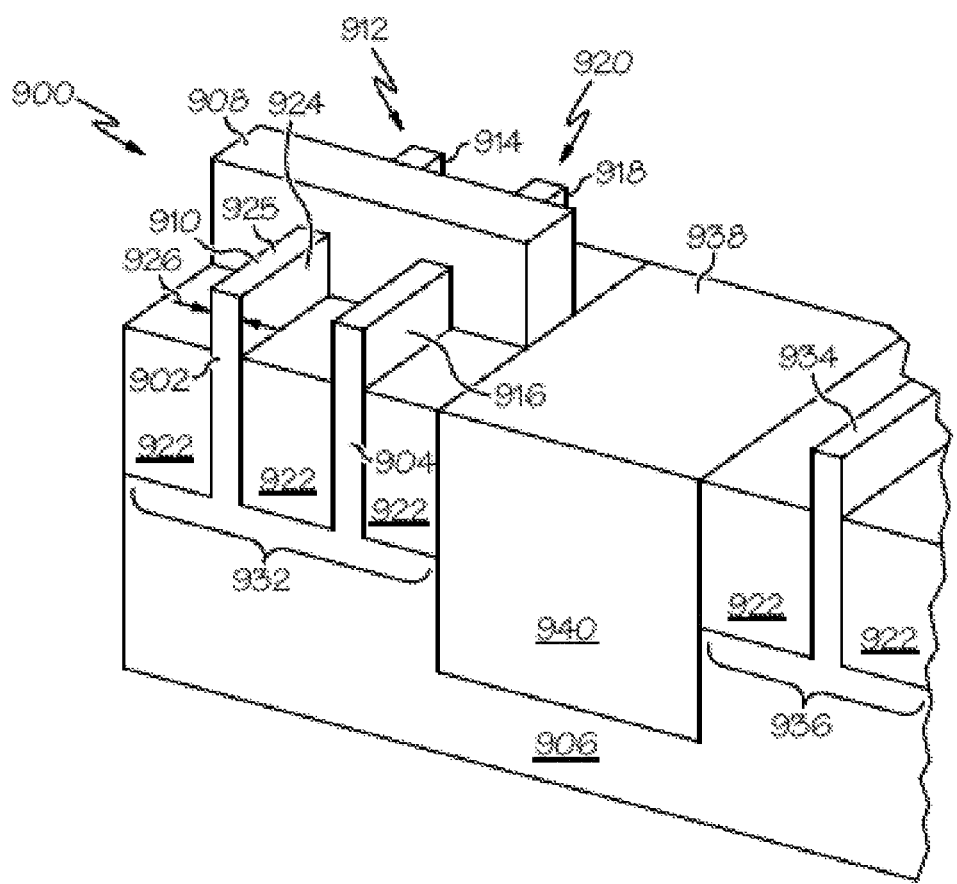
FIG. 15 illustrates, in partially cut away perspective view, a portion of an IC fabricated with FinFETs applicable to an SRAM IC.

FIG. 15 illustrates, in a cut away perspective view, a portion of a FinFET integrated circuit (IC) 900 and describes the structure of FinFETs in accordance with one embodiment. The illustrated portion of IC 900 includes two fins 902 and 904 that are formed from and extend upwardly from a bulk semiconductor substrate 906. Fins 902 and 904 are located in active area 932. A gate electrode 908 overlies the two fins and is electrically insulated from the fins by a gate insulator (not illustrated). End 910 of fin 902 is appropriately impurity doped to form the source of a FinFET 912 and end 914 of that fin is appropriately impurity doped to form the drain of the FinFET. Similarly, ends 916 and 918 of fin 904 form the source and drain, respectively, of another FinFET 920. Active area 932 thus includes two FinFETs 912 and 920 having a common gate electrode. In another configuration, if source 910 and 916 are electrically coupled together and drains 914 and 918 are electrically coupled together the structure would be a two-fin FinFET having twice the gate width of either FinFET 912 or 920. Oxide layer 922 forms electrical isolation between fins 902 and 904. The channel of FinFET 912 extends along the sidewall 924 of fin 902 beneath gate electrode 908 as well as along the opposite sidewall not visible in this perspective view. The advantage of the FinFET structure is that although the fin has only the narrow width represented by the arrows 926, the channel has a width represented by at least twice the height of the fin above oxide 922. The channel width thus can be much greater than fin width. The illustrated portion of IC 900 also includes fin 934 that extends upwardly from semiconductor substrate 906 in active area 936. Deep trench isolation region 938, filled with an insulating material 940 provides electrical isolation between active areas 932 and 936 as required by the circuit being implemented.

In accordance with one embodiment, an SRAM IC such as SRAM IC 100 is implanted by fabricating transistors 32, 34, 42, and 46 as FinFETs similar to FinFETs 912 and 920. The FinFET SRAM IC is fabricated and interconnected in similar manner to that illustrated in FIGS. 5-11. After depositing and patterning layer of insulating material 390, fabrication of the IC proceeds in the same manner as illustrated in FIGS. 12-15.

Those of skill in the art will understand that other masking and processing operations beyond those enumerated above may be used in the fabrication of an SRAM IC. Other masks may be used, for example, to process peripheral circuits surrounding the memory array. Other processing operations may be employed to form halo implants, source-drain extensions, bonding pads, passivation layers, and the like.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. An SRAM integrated circuit comprising:
   pull up and pull down transistors of an SRAM cell fabricated in and on a silicon substrate;
   a layer of insulating material overlying the pull up and pull down transistors;
   pass gate transistors of the SRAM cell fabricated in and on a semiconducting layer overlying the layer of insulating material;
   a first metal-filled via extending through the layer of insulating material and coupled to a second metal layer; and
   a second metal-filled via extending through the layer of insulating material and coupled to a third metal layer;
   wherein the pull up and pull down transistors are interconnected as a pair of cross coupled inverters by the second metal layer and the third metal layer.

2. The SRAM integrated circuit of claim 1 wherein the SRAM cell comprises a first pass gate transistor coupled to the first metal-filled via and a second pass gate transistor coupled to the second metal-filled via, each pass gate transistor formed in the semiconductor layer and wherein the semiconductor layer is a material chosen from germanium and indium gallium arsenide.

3. The SRAM integrated circuit of claim 2 wherein each pass gate transistor comprises a source region and a drain region, each of the source region and the drain region formed of a nickel alloy, the nickel alloy of selected ones of the source region and drain region extending through the semiconductor layer and contacting one of the first metal-filled via or the second metal-filled via.

4. The SRAM integrated circuit of claim 3 wherein each pass gate transistor further comprises an aluminum oxide gate insulator and a tantalum nitride gate electrode.

5. The SRAM integrated circuit of claim 4 further comprising:
   a second layer of insulating material overlying the gate electrode;
   via openings etched through the second layer and exposing selected ones of the source regions or drain regions;
   metal-filled vias formed in the via openings; and
   metal bit lines formed overlying the second layer and contacting the metal-filled vias.

6. The SRAM integrated circuit of claim 1 wherein the pass gate transistors each comprise a tantalum nitride gate electrode overlying an aluminum oxide gate dielectric.

7. The SRAM integrated circuit of claim 6 wherein the pass gate transistors each have source and drain electrodes comprising nickel alloyed with germanium or nickel alloyed with indium gallium arsenide.

8. The SRAM integrated circuit of claim 1 wherein the semiconducting layer is selected from germanium and indium gallium arsenide.

9. The SRAM integrated circuit of claim 1 wherein the pull up and pull down transistors are FinFETs.

10. The SRAM integrated circuit of claim 1 wherein the semiconducting layer has a band edge energy level in the range of about 4.4 eV to about 4.6 eV below the vacuum level.

11. A method for fabricating an SRAM integrated circuit comprising:
   fabricating pull up and pull down transistors of a six-transistor SRAM cell in and on a single silicon substrate;
   depositing a layer of insulator overlying the pull up and pull down transistors;
   forming pass gate transistors of the six-transistor SRAM cell in and on a semiconductor layer overlying the layer of insulator; and
   forming metal-filled vias extending through the layer of insulator and selectively coupling the pass gate transistors to the pull up and pull down transistors;
   wherein forming metal-filled vias extending through the layer of insulator comprises forming a first metal-filled via and a second metal-filled via extending through the layer of insulator, wherein the first metal-filled via is coupled to a second metal layer, the second metal-filled via is coupled to a third metal layer, and the pull up and pull down transistors are interconnected as a pair of cross coupled inverters by the second metal layer and third metal layer.

* * * * *